(12) United States Patent
Eeh et al.

(10) Patent No.: US 9,178,137 B2
(45) Date of Patent: Nov. 3, 2015

(54) MAGNETORESISTIVE ELEMENT AND MAGNETIC MEMORY

(71) Applicants: Youngmin Eeh, Kawagoe (JP); Katsuya Nishiyama, Yokohama (JP); Daisuke Ikeno, Yokkaichi (JP); Toshihiko Nagase, Tokyo (JP); Tadashi Kai, Tokyo (JP); Daisuke Watanabe, Kai (JP)

(72) Inventors: Youngmin Eeh, Kawagoe (JP); Katsuya Nishiyama, Yokohama (JP); Daisuke Ikeno, Yokkaichi (JP); Toshihiko Nagase, Tokyo (JP); Tadashi Kai, Tokyo (JP); Daisuke Watanabe, Kai (JP)

(*) Notice: Subject to any disclaimer, the term of this patent is extended or adjusted under 35 U.S.C. 154(b) by 99 days.

(21) Appl. No.: 13/963,682

(22) Filed: Aug. 9, 2013

(65) Prior Publication Data

US 2014/0284539 A1 Sep. 25, 2014

Related U.S. Application Data

(60) Provisional application No. 61/804,478, filed on Mar. 22, 2013.

(51) Int. Cl.
*H01L 43/08* (2006.01)
*H01L 43/12* (2006.01)
*H01L 27/22* (2006.01)

(52) U.S. Cl.
CPC ............... *H01L 43/12* (2013.01); *H01L 43/08* (2013.01); *H01L 27/226* (2013.01)

(58) Field of Classification Search
CPC .................... H01L 43/08; G11C 11/14–11/16; G11C 11/161
See application file for complete search history.

(56) References Cited

U.S. PATENT DOCUMENTS

| 7,596,015 B2 * | 9/2009 | Kitagawa et al. | 365/158 |
| 8,036,025 B2 * | 10/2011 | Nagase et al. | 365/158 |
| 2012/0023386 A1 * | 1/2012 | Oh et al. | 714/769 |
| 2012/0205758 A1 * | 8/2012 | Jan et al. | 257/421 |
| 2012/0300542 A1 * | 11/2012 | Uchida et al. | 365/171 |
| 2013/0032910 A1 * | 2/2013 | Jung et al. | 257/421 |
| 2014/0203383 A1 * | 7/2014 | Guo | 257/421 |
| 2014/0284733 A1 * | 9/2014 | Watanabe et al. | 257/421 |

OTHER PUBLICATIONS

H. Sato, et al., "Perpendicular-anisotropy CoFeB—MgO magnetic tunnel junctions with a MgO/CoFeB/Ta/CoFeB/MgO recording structure", Applied Physics Letters 101, 022414 (2012), four pages (in English).

* cited by examiner

*Primary Examiner* — Allison P Bernstein
(74) *Attorney, Agent, or Firm* — Holtz, Holtz, Goodman & Chick PC

(57) ABSTRACT

A magnetoresistive element includes first and magnetic layers, first and second non-magnetic layers and a W layer. Each of the first and second magnetic layers includes an axis of easy magnetization in a direction perpendicular to a film plane. The first magnetic layer has a variable magnetization direction. The second magnetic layer has an invariable magnetization direction. The first non-magnetic layer is provided between the first and second magnetic layers. The second non-magnetic layer is arranged on a surface of the first magnetic layer opposite to a surface on which the first non-magnetic layer is arranged and contains MgO. The W layer is arranged on a surface of the second non-magnetic layer opposite to a surface on which the first magnetic layer is arranged, and is in contact with the surface of the second non-magnetic layer.

12 Claims, 3 Drawing Sheets

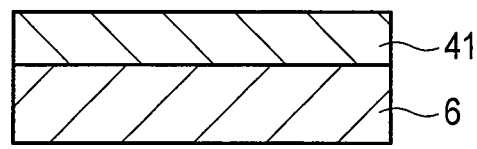
F I G. 3
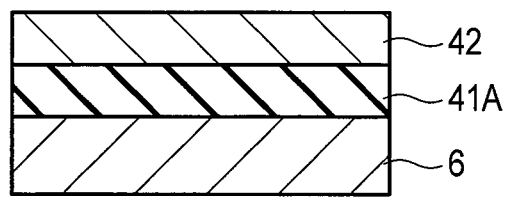
F I G. 4
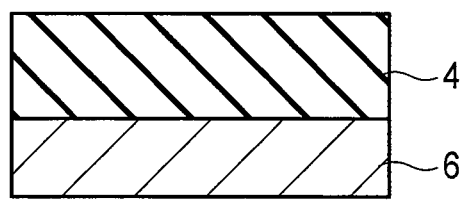
F I G. 5

MAGNETORESISTIVE ELEMENT AND MAGNETIC MEMORY

CROSS-REFERENCE TO RELATED APPLICATIONS

This application claims the benefit of U.S. Provisional Application No. 61/804,478, filed Mar. 22, 2013, the entire contents of which are incorporated herein by reference.

FIELD

Embodiments described herein relate generally to a magnetoresistive element and a magnetic memory.

BACKGROUND

In recent years, magnetic random access memories (hereinafter abbreviated MRAM), which use a magnetoresistive effect of a ferromagnetic substance, have been attracting attention as next-generation solid-state nonvolatile memories capable of reading and writing data at high speed, offering large-capacity storage, and operating on low power consumption. In particular, magnetoresistive elements including a ferromagnetic tunneling junction have been gaining attention since such magnetoresistive elements were discovered to exhibit a high magnetoresistance rate. A ferromagnetic tunneling junction has a three-layer stacked structure including a storage layer whose magnetization direction is variable, an insulating material layer, and a fixed layer facing the storage layer and maintaining a predetermined magnetization direction.

The magnetoresistive element including a ferromagnetic tunneling junction is also called a magnetic tunnel junction (MTJ) element, and a writing (spin-transfer torque writing) method which uses a spin-momentum transfer (SMT) has been proposed as a writing method thereof. A perpendicular magnetization film, which includes an axis of easy magnetization in a direction perpendicular to a film plane, has been considered to be used as a ferromagnetic material forming the magnetoresistive element.

BRIEF DESCRIPTION OF THE DRAWINGS

FIGS. 3, 4 and 5 are cross-sectional views illustrating a method of manufacturing an underlying layer (MgO) in the magnetoresistive element.

DETAILED DESCRIPTION

Hereinafter, a magnetoresistive element and a magnetic memory according to embodiments will be described with reference to the accompanying drawings. In the description that follows, the structural elements having the same function and configuration will be denoted by the same reference numbers and repeated description will be given only when necessary.

In general, according to one embodiment, a magnetoresistive element includes a first magnetic layer, a second magnetic layer, a first non-magnetic layer, a second non-magnetic layer, and a W layer. The first magnetic layer includes an axis of easy magnetization in a direction perpendicular to a film plane and a variable magnetization direction. The second magnetic layer includes an axis of easy magnetization in the direction perpendicular to the film plane and an invariable magnetization direction. The first non-magnetic layer is provided between the first magnetic layer and the second magnetic layer. The second non-magnetic layer is arranged on a surface of the first magnetic layer opposite to a surface on which the first non-magnetic layer is arranged. The second non-magnetic layer contains MgO. The W layer is arranged on a surface of the second non-magnetic layer opposite to a surface on which the first magnetic layer is arranged. The W layer is in contact with the surface of the second non-magnetic layer.

First Embodiment

A description will be given on a magnetoresistive element according to a first embodiment.

[1] Structure of Magnetoresistive Element

In the present specification and the claims, the term magnetoresistive element refers to a magnetic tunnel junction (MTJ) element in which a semiconductor or an insulating material is used as a tunnel barrier layer. In the cross-sectional views of FIG. 1 and subsequent drawings, only the main parts of the magnetoresistive element are shown; however, other layers may also be included as long as the illustrated structures are included.

Figure 1:
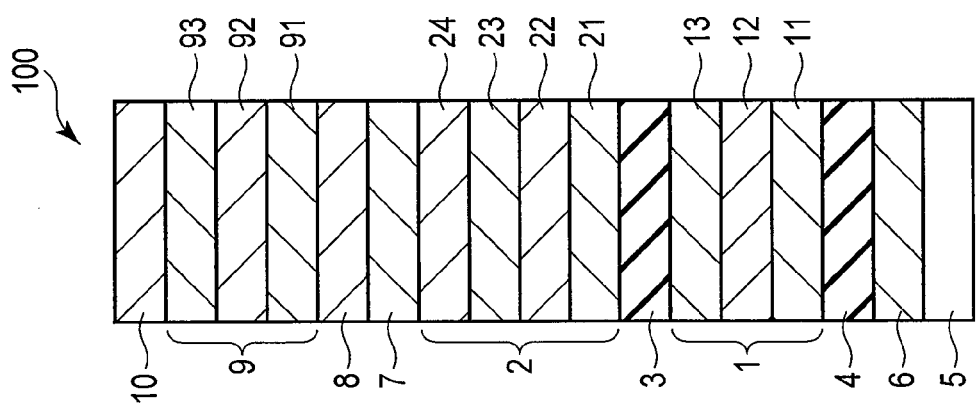
FIG. 1 is a cross-sectional view illustrating a structure of a magnetoresistive element according to a first embodiment.

FIG. 1 is a cross-sectional view illustrating a structure of the magnetoresistive element according to the first embodiment.

A magnetoresistive element 100 performs writing by a spin-transfer torque magnetization reversal method. That is, information is stored by changing relative angles of magnetization between a storage layer and a reference layer to a parallel state and an antiparallel state (i.e., minimum resistance and maximum resistance) and associating the states with binary 0 or 1, according to a direction of a spin-polarized current flowing in a direction perpendicular to a film plane relative to each layer.

As shown in FIG. 1, the magnetoresistive element 100 at least comprises two magnetic layers: a magnetic layer (storage layer) 1; and a magnetic layer (reference layer) 2, and a non-magnetic layer 3 provided between the magnetic layer 1 and the magnetic layer 2.

The magnetic layer 1 is provided on an underlying layer 4, and includes an axis of easy magnetization in a direction perpendicular to a film plane. A magnetization direction of the magnetic layer 1 is variable. The magnetization direction being variable means that the magnetization direction changes before and after writing. In the present specification, the term film plane refers to an upper surface of a target layer. Hereinafter, the magnetic layer 1 will be referred to as a storage layer (also a free layer, a magnetization free layer, a magnetization variable layer, or a recording layer). Magnetization in a direction perpendicular to the film plane will be referred to as perpendicular magnetization.

The storage layer 1 has a structure in which a first storage layer (CoFeB layer) 11, an insertion layer (W or Ta layer) 12, and a second storage layer (FeCoB layer) 13 are stacked in this order on the underlying layer 4.

The magnetic layer 2 includes an axis of easy magnetization in a direction perpendicular to the film plane, and a magnetization direction of the magnetic layer 2 is invariable or fixed with respect to the storage layer 1. The magnetization direction being invariable means that the magnetization direction does not change before and after writing. Hereinafter, the magnetic layer 2 will be referred to as a reference layer (also a fixed layer, a magnetization fixed layer, a pinned layer, a standard layer, and a magnetization standard layer).

The reference layer 2 has a structure in which an interface reference layer (CoFeB layer) 21, a function layer (Ta layer) 22, a Co layer 23, and an artificial lattice layer ([Co/Pt]n) 24 are stacked in this order on the non-magnetic layer 3.

Designations of structures that can be regarded essentially equal to those of the present embodiment are not limited to those mentioned above.

The non-magnetic layer 3 is also called a tunnel barrier layer, and is formed of an insulating film of an oxide, such as MgO. In the description that follows, the non-magnetic layer 3 will be referred to as a tunnel barrier layer.

In the magnetoresistance element 100 of the present embodiment, a buffer layer 6 is formed on a semiconductor substrate 5, and the underlying layer 4 is formed on the buffer layer 6. Further, the storage layer 1, the tunnel barrier layer 3, and the reference layer 2 are sequentially formed on the underlying layer 4. A detailed structure and characteristics of the buffer layer 6 and the underlying layer 4 will be described later.

A spacer layer (Ru layer, for example) 7 is formed on the reference layer 2. A shift-canceling layer 8 is formed on the spacer layer 7. The shift-canceling layer 8 relaxes and adjusts a shift of a switching current of the storage layer 1 caused by a leakage magnetic field from the reference layer 2.

A cap layer 9 is formed on the shift-canceling layer 8. A hard mask 10 is formed on the cap layer 9. The cap layer 9 and the hard mask 10 function mainly as protective layers which prevent oxidation of the magnetic layers, for example. The cap layer 9 has a structure in which a Pt layer, a W layer, and a Ru layer are stacked in this order on the shift-canceling layer 8.

The magnetoresistive element 100 of the first embodiment shown in FIG. 1 has a top-pin structure, in which the storage layer 1 is formed on the underlying layer 4, and the tunnel barrier layer 3 and the reference layer 2 are formed on the storage layer 1. The present embodiment may also take a bottom-pin structure, in which the reference layer 2 is formed on the underlying layer 4, and the tunnel barrier layer 3 and the storage layer 1 are formed on the reference layer 2.

Next, writing and reading operations in the magnetoresistive element 100 of the present embodiment will be briefly discussed.

The magnetoresistive element 100 is a magnetoresistive element used in a spin-transfer torque writing method. That is, in a writing operation, by letting a current flow in a direction perpendicular to the film plane from the reference layer 2 to the storage layer 1 or from the storage layer 1 to the reference layer 2, electrons containing spin information are injected into the storage layer 1 from the reference layer 2. Since a spin angular momentum of the injected electrons is transferred to electrons of the storage layer 1 according to the law of conservation of spin angular momentum, magnetization of the storage layer 1 is reversed.

For example, when a magnetization direction of the storage layer 1 and a magnetization direction of the reference layer 2 are antiparallel, a current flows from the storage layer 1 to the reference layer 2. In this case, electrons flow from the reference layer 2 to the storage layer 1. The electrons spin-polarized by the reference layer 2 flow to the storage layer 1 through the tunnel barrier layer 3, the spin angular momentum is transferred to the storage layer 1, and the magnetization direction of the storage layer 1 is reversed so as to be parallel to the magnetization direction of the reference layer 2.

When the magnetization direction of the storage layer 1 and the magnetization direction of the reference layer 2 are parallel, on the other hand, a current flows from the reference layer 2 to the storage layer 1. In this case, electrons flow from the storage layer 1 to the reference layer 2. The electrons spin-polarized by the storage layer 1 flow to the reference layer 2 through the tunnel barrier layer 3, and electrons having the same spin as the magnetization direction of the reference layer 2 pass through the reference layer 2, while electrons having a spin opposite to the magnetization direction of the reference layer 2 are reflected off an interface between the tunnel barrier layer 3 and the reference layer 2 and flow to the storage layer 1 through the tunnel barrier layer 3. As a result, the spin angular momentum is transferred to the storage layer 1 and the magnetization direction of the storage layer 1 is reversed so as to be antiparallel to the magnetization direction of the reference layer 2.

When information is read from the magnetoresistive element 1, a read current which does not reverse magnetization of the storage layer 1 flows between the storage layer 1 and the reference layer 2 through the tunnel barrier layer 3. Thereby, information can be read from the magnetoresistive element 100.

[2] Structures of Buffer Layer, Underlying layer, and Storage Layer

Next, structures of the buffer layer 6, the underlying layer 4, and the storage layer 1 according to the present embodiment will be described in detail.

Figure 2:
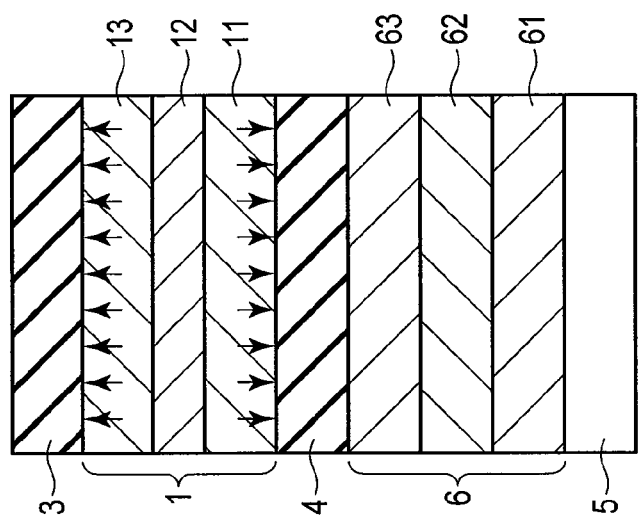
FIG. 2 is a cross-sectional view illustrating a structure from a buffer layer to a tunnel barrier layer on a semiconductor substrate in the magnetoresistive element.

FIG. 2 is a cross-sectional view illustrating a structure from the buffer layer 6 to the tunnel barrier layer 3 on the semiconductor substrate 5.

The buffer layer 6, the underlying layer 4, the storage layer 1, and the tunnel barrier layer 3 are sequentially formed on the semiconductor substrate 5.

The buffer layer 6 has a structure in which a first buffer layer 61 and a second buffer layer (a CoFeB layer 62 and a W layer 63) are stacked in this order on the semiconductor substrate 5. The first buffer layer 61 is formed of W, Ta, Hf, or the like. The thickness of the first buffer layer 61 is approximately 10-100 Å.

The CoFeB layer 62 is formed of $(CoFe_{0-100})B_{20-50}$. That is, the CoFeB layer 62 has a composition in which B is contained at a ratio of 20-50 at %, and a ratio of Co to Fe falls within the range of 1:1 to 0:1. The thickness of the CoFeB layer 62 is approximately 5-10 Å.

The W layer 63 should preferably be amorphous, and has a thickness of approximately 5-20 Å. The W layer 63 maintains an amorphous state until the thickness reaches approximately 20 Å. The W layer 63 does not necessarily need to be amorphous, and may also be monocrystalline or polycrystalline.

The underlying layer 4 includes an MgO layer formed on the W layer 63 of the buffer layer 6. The MgO layer is formed of MgO in an oxygen-deficient state, which contains oxygen in an amount less than that of MgO with a stoichiometric composition. That is, an amount of oxygen per unit volume contained in the MgO layer of the underlying layer 4 is less than that of the MgO forming the tunnel barrier layer 3.

The storage layer 1 has a structure in which the first storage layer (CoFeB layer) 11, the insertion layer (W or Ta layer) 12, and the second storage layer (CoFeB layer) 13 are stacked in this order on the underlying layer 4. The CoFeB layers 11, 13 are formed of $(CoFe_{50-100})B_{10-20}$. That is, the CoFeB layer 11 has a composition in which B is contained at a ratio of 10-20 at %, and a ratio of Co to Fe falls within the range of 0.5:0.5 to 0:1. The thickness of the CoFeB layer 11 is approximately 5-20 Å. The thickness of the CoFeB layer 13 is approximately 5-15 Å. The thickness of the insertion layer 12 is approximately 1-5 Å. In the above-described example, the storage layer 1 has a stacked structure, but may also be a single CoFeB layer.

A tunnel barrier layer 3 formed of an MgO layer is arranged on the CoFeB layer 13 of the storage layer 1.

By using the structure shown in FIG. 2, perpendicular magnetic anisotropy can be generated in the CoFeB layers 13, 11 in the vicinity of an interface between the MgO layers 3, 4 provided on both surface sides of the storage layer 1 and the storage layer 1. Further, the resistance of the underlying layer (MgO layer) 4 can be reduced to $0.5 \ \mu\Omega/cm^2$ or less.

In the present embodiment, an MgO layer in an oxygen-deficient state is formed as the underlying layer 4 on the W layer 63 of the buffer layer 6. Thereby, the series resistance of the underlying layer (MgO layer) 4 arranged between the buffer layer 6 and the storage layer 1 can be greatly reduced.

A method of forming MgO in an oxygen-deficient state as the underlying layer 4 will be described below.

FIGS. 3, 4 and 5 are cross-sectional views illustrating a method of manufacturing MgO as the underlying layer 4.

As shown in FIG. 3, an Mg layer 41 is formed on the buffer layer 6 by sputtering, for example, so as to have a thickness of approximately 2-10 Å.

After that, as shown in FIG. 4, an MgO layer 41A is formed by oxidizing the Mg layer 41. After that, an Mg layer 42 is formed on the MgO layer 41A by sputtering, so as to have a thickness of 3-15 Å. The thickness of the Mg layer 42 should preferably be equal to or greater than the thickness of the Mg layer 41.

Thereby, oxygen in the MgO layer 41A is diffused into the Mg layer 42, and an MgO layer 4 in an oxygen-deficient state is formed as shown in FIG. 5.

In the above-described example, an MgO layer in an oxygen-deficient state is formed by oxidizing an Mg layer and stacking an Mg layer thereon; however, MgO in an oxygen-deficient state may be directly deposited on the buffer layer 6 by sputtering using MgO in an oxygen-deficient state as a target.

Second Embodiment

In the first embodiment, an example of forming a W layer on a surface of a buffer layer has been described. In a second embodiment, on the other hand, an example of forming a Ti layer on a surface of the buffer layer will be described. Since an overall structure of the magnetoresistive element is the same as that of the first embodiment, a description thereof will be omitted.

[1] Structures of Buffer Layer, Underlying layer, and Storage Layer

A detailed description will be given on structures of a buffer layer 6, a underlying layer 4, and a storage layer 1 according to the present embodiment.

Figure 6:
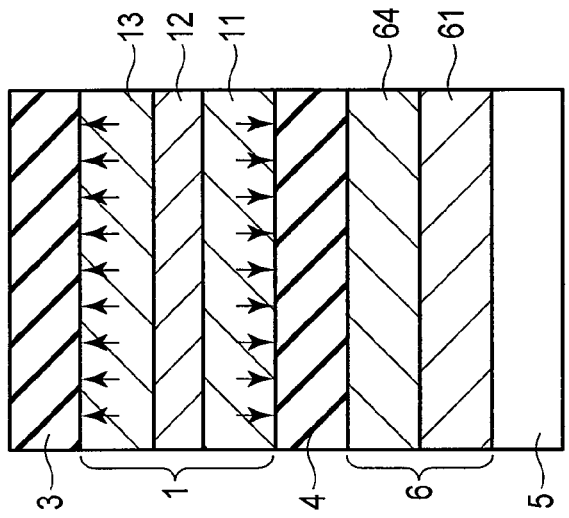
FIG. 6 is a cross-sectional view illustrating a structure from a buffer layer to a tunnel barrier layer on a semiconductor substrate according to a second embodiment.

FIG. 6 is a cross-sectional view illustrating a structure from the buffer layer 6 to a tunnel barrier layer 3 on a semiconductor substrate 5.

The buffer layer 6, the underlying layer 4, the storage layer 1, and the tunnel barrier layer 3 are sequentially formed on a semiconductor substrate 5.

The buffer layer 6 has a structure in which a first buffer layer 61 and a second buffer layer (Ti layer 64) are stacked in this order on the semiconductor substrate 5. The first buffer layer 61 is formed of W, Ta, Hf, or the like. The thickness of the first buffer layer 61 is approximately 10-100 Å.

The Ti layer 64 should preferably be polycrystalline, and has a thickness of approximately 10-20 Å.

The underlying layer 4 includes an MgO layer formed on the Ti layer 64 of the buffer layer 6. The MgO layer is formed of MgO in an oxygen-deficient state, and contains oxygen in an amount less than that of MgO with a stoichiometric composition. That is, an amount of oxygen per unit volume contained in the MgO layer of the underlying layer 4 is less than that of the MgO forming the tunnel barrier layer 3.

The storage layer 1 has a structure in which a first storage layer (CoFeB layer) 11, an insertion layer (W or Ta layer) 12, and a second storage layer (CoFeB layer) 13 are stacked in this order on the underlying layer 4, as in the first embodiment. The CoFeB layers 11, 13 are formed of $(CoFe_{50-100})B_{10-20}$. That is, the CoFeB layer 11 has a composition in which B is contained at a ratio of 10-20 at %, and a ratio of Co to Fe falls within the range of 0.5:0.5 to 0:1. The thickness of the CoFeB layer 11 is approximately 5-20 Å. The thickness of the CoFeB layer 13 is approximately 5-15 Å. The thickness of the insertion layer 12 is approximately 1-5 Å. In the above-described example, the storage layer 1 has a stacked structure; however, the storage layer 1 may also be a single CoFeB layer.

A tunnel barrier layer 3 formed of an MgO layer is arranged on the CoFeB layer 13 of the storage layer 1.

By using the structure shown in FIG. 6, perpendicular magnetic anisotropy can be generated in the CoFeB layers 13, 11 in the vicinity of an interface between the MgO layers 3, 4 provided on both surface sides of the storage layer 1 and the storage layer 1. Further, the resistance of the underlying layer (MgO layer) 4 can be reduced to $0.5 \ \mu\Omega/cm^2$ or less.

In the present embodiment, an MgO layer in an oxygen-deficient state is formed as an underlying layer 4 on a Ti layer 64 of a buffer layer 6. Thereby, the series resistance of the underlying layer (MgO layer) 4 arranged between the buffer layer 6 and the storage layer 1 can be greatly reduced.

Effect

In a conventional MTJ having perpendicular magnetic anisotropy, the thickness of a CoFeB layer must be 1 nm or less, in order to generate perpendicular magnetic anisotropy in a storage layer. This is because, since interface magnetic anisotropy is derived only from an interface between an MgO tunnel barrier layer and a CoFeB storage layer, perpendicular magnetic anisotropy energy of the entire storage layer rapidly decreases as the film thickness of the CoFeB increases.

A structure has been proposed in which an MgO layer is provided on the opposite side of a tunnel barrier layer, a storage layer is divided into two, and a non-magnetic layer of Ta, for example, is interposed between CoFeB storage layers. When the MgO layer is used as an underlying layer or a cap layer of the storage layer as in this case, however, a high resistance of MgO, which functions as a series parasitic resistance in an MTJ, can cause increase in resistance and deterioration in magnetoresistance (MR) ratio.

To address this, the present embodiment uses W or Ti as a buffer layer and forms MgO on the buffer layer, as described above. Thereby, perpendicular magnetic anisotropy can be generated in the storage layer to a sufficient degree, and the series resistance of the underlying layer (MgO layer) can be greatly reduced. It has been discovered that this is furthermore effective by making MgO in an oxygen-deficient state.

Figure 7:
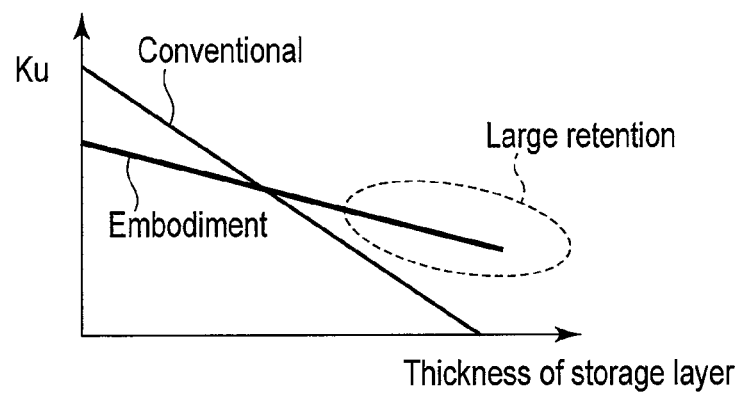
FIG. 7 is a graph comparing perpendicular magnetic anisotropy energy between the storage layer of the embodiments and a conventional storage layer.

FIG. 7 shows an example in which perpendicular magnetic anisotropy energy is compared between the storage layer of the present embodiment and a conventional storage layer. The horizontal axis represents the thickness of the storage layer (CoFeB), and the vertical axis represents the perpendicular magnetic anisotropy energy of the storage layer.

In the conventional storage layer, perpendicular magnetic anisotropy energy (Ku) rapidly decreases as the film thickness increases. In the present embodiment, on the other hand, since interface perpendicular magnetic anisotropy functions from both surface sides of the storage layer, large perpendicular magnetic anisotropy energy can be maintained even if the film thickness of the storage layer is increased. Further, by increasing volume components of the storage layer, retention properties can be improved.

That is, magnetic anisotropy energy of the storage layer derived from interface perpendicular anisotropy decreases as the film thickness of the storage layer increases. Accordingly, the film thickness of the storage layer cannot be increased. It is advantageous for the retention properties of the storage layer, on the other hand, to make the film thickness increased by volume components and demagnetizing-field components. Accordingly, the retention properties of the storage layer can be increased as the film thickness dependence of Hk decreases in the term of Hk(t) in the following formulas:

Retention=$Ku(t)*V(t)/kBT$ $Ku=Ms*t*Hk(t)/2$−demagnetization term$(t)$, where $K_u$ denotes the perpendicular magnetic anisotropy, V denotes the volume of a perpendicular magnetic material, kg denotes the Boltzmann constant, T denotes the temperature of the perpendicular magnetic material, $M_S$ denotes saturation magnetization, t denotes the thickness of a storage layer, and Hk denotes an anisotropy field.

Third Embodiment

In a third embodiment, a description will be given on a magnetic random access memory (MRAM). The MRAM of the third embodiment has a structure in which the magnetoresistive element according to the first and second embodiments is used as a storage element.

Figure 8:
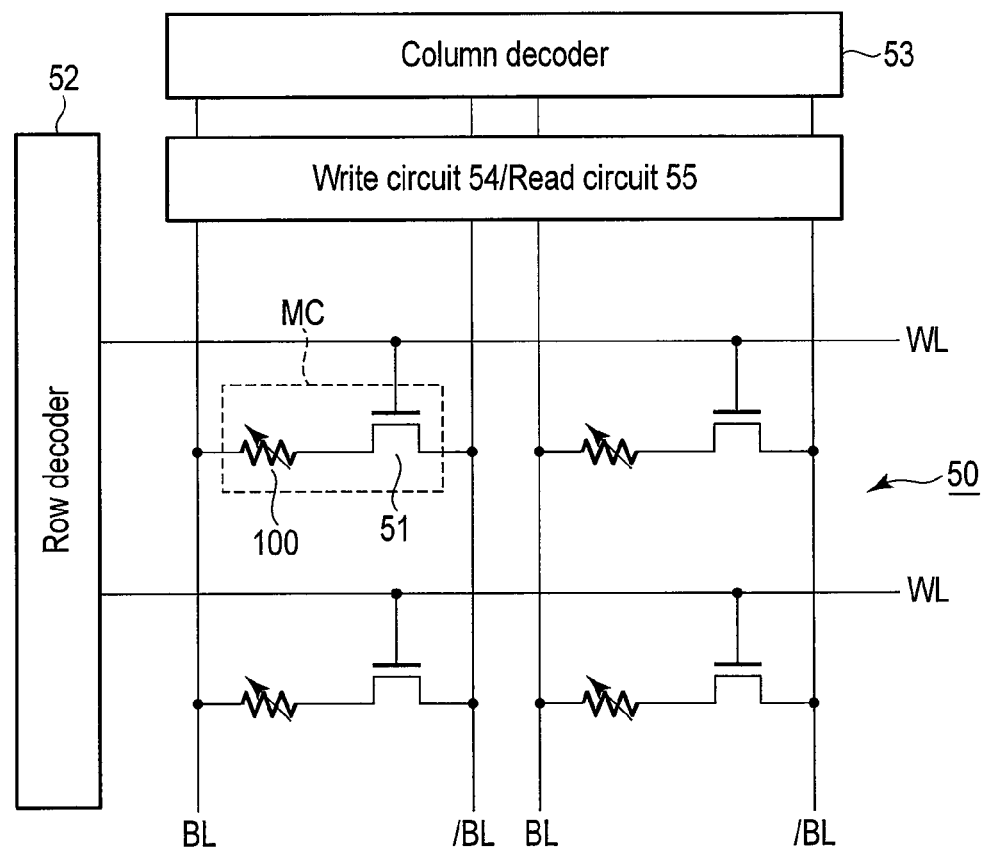
FIG. 8 is a circuit diagram illustrating a configuration of an MRAM according to a third embodiment.

FIG. 8 is a circuit diagram illustrating a configuration of the MRAM according to the third embodiment.

The MRAM comprises a memory cell array 50 including a plurality of memory cells MC arranged in a matrix pattern. In the memory cell array 50, a plurality of pairs of bit lines BL, /BL are aligned so as to extend in a column direction. Further, in the memory cell array 50, a plurality of word lines WL are aligned so as to extend in a row direction.

Each of a plurality of memory cells MC is arranged at an intersection of the bit line BL and the word line WL. Each of the memory cells MC includes a magnetoresistive element 100 and a select transistor (such as n-channel MOS transistor) 51. One end of the magnetoresistive element 100 is connected to the bit line BL. The other end of the magnetoresistive element 100 is connected to the drain of the select transistor 51. The source of the select transistor 51 is connected to the bit line /BL. The gate of the select transistor 51 is connected to the word line WL.

A row decoder 52 is connected to the word line WL. A write circuit 54 and a read circuit 55 are connected to the pair of bit lines BL, /BL. A column decoder 53 is connected to the write circuit 54 and the read circuit 55. Each of the memory cells MC is selected by the row decoder 52 and the column decoder 53.

Writing of data to the memory cells MC is performed as will be described below. In order to select a memory cell MC to which data is written, a word line WL to be connected to the memory cell MC is activated. Thereby, the select transistor 51 is turned on.

According to data to be written, a bi-directional write current Iw is supplied to the magnetoresistive element 100. More specifically, when a write current Iw is supplied to the magnetoresistive element 100 in a direction from left to right, a write circuit 54 applies a positive voltage to the bit line BL, and a ground voltage to the bit line /BL. When a write current Iw is supplied to the magnetoresistive element 100 in a direction from right to left, the write circuit 54 applies a positive voltage to the bit line /BL, and a ground voltage to the bit line BL. Thereby, binary 0 or binary 1 can be written to the memory cell MC.

Reading of data from the memory cell MC is performed as will be described below. A select transistor 51 of a memory cell MC to be selected is turned on. The read circuit 55 supplies a read current Ir, which flows in a direction from right to left, for example, to the magnetoresistive element 100, i.e., supplies a read current Ir from the bit line /BL to the bit line BL. The read circuit 55 detects the resistance of the magnetoresistive element 100 on the basis of the read current Ir. Further, the read circuit 55 reads data stored in the magnetoresistive element 100 on the basis of the detected resistance.

As described above, according to the present embodiment, by using MgO as an underlying layer of a storage layer in an MTJ, interface magnetic anisotropy can be generated from both of an MgO tunnel barrier layer and an MgO underlying layer. Thereby, retention properties can be greatly improved. Further, by making the MgO underlying layer in an O-deficient state and forming the buffer layer of W or Ti, the resistance of the MgO underlying layer can be greatly reduced. Thereby, an MTJ having a high MR ratio can be formed while using the MgO underlying layer.

Each of above-described MTJ structures can be introduced as MTJ elements of memory cells. Memory cells, memory cell arrays and memory devices is disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a first magnetic layer which includes an axis of easy magnetization in a direction perpendicular to a film plane and a variable magnetization direction;
   a second magnetic layer which includes an axis of easy magnetization in the direction perpendicular to the film plane and an invariable magnetization direction;
   a first non-magnetic layer provided between the first magnetic layer and the second magnetic layer;
   a second non-magnetic layer arranged on a surface of the first magnetic layer opposite to a surface on which the first non-magnetic layer is arranged, the second non-magnetic layer containing MgO; and a W layer arranged on a surface of the second non-magnetic layer opposite to a surface on which the first magnetic layer is arranged, the W layer being in contact with the surface of the second non-magnetic layer, and the W layer including an amorphous state.

2. The magnetoresistive element according to claim 1, further comprising:
a CoFeB layer arranged on a surface of the W layer opposite to a surface on which the second non-magnetic layer is arranged, the CoFeB layer being in contact with the surface of the W layer.

3. The magnetoresistive element according to claim 1, wherein the first non-magnetic layer contains MgO.

4. The magnetoresistive element according to claim 3, wherein the second non-magnetic layer contains oxygen per unit volume in an amount less than that of the first non-magnetic layer.

5. The magnetoresistive element according to claim 1, wherein the first magnetic layer includes a first CoFe-containing layer, and a second CoFe-containing layer, the first CoFe-containing layer contacts the second non-magnetic layer, and the second CoFe-containing layer contacts the first non-magnetic layer.

6. The magnetoresistive element according to claim 1, wherein the MgO contained in the second non-magnetic layer contains oxygen in an amount less than that of MgO with a stoichiometric composition.

7. A magnetoresistive element comprising:
a first magnetic layer which includes an axis of easy magnetization in a direction perpendicular to a film plane and a variable magnetization direction;
a second magnetic layer which includes an axis of easy magnetization in the direction perpendicular to the film plane and an invariable magnetization direction;
a first non-magnetic layer provided between the first magnetic layer and the second magnetic layer;
a second non-magnetic layer arranged on a surface of the first magnetic layer opposite to a surface on which the first non-magnetic layer is arranged, the second non-magnetic layer containing MgO; and
a Ti layer arranged on a surface of the second non-magnetic layer opposite to a surface on which the first magnetic layer is arranged, the Ti layer being in contact with the surface of the second non-magnetic layer, and the Ti layer including a polycrystalline state.

8. The magnetoresistive element according to claim 7, wherein the first non-magnetic layer contains MgO.

9. The magnetoresistive element according to claim 8, wherein the second non-magnetic layer contains oxygen per unit volume in an amount less than that of the first non-magnetic layer.

10. The magnetoresistive element according to claim 8, wherein the first magnetic layer includes a first CoFe-containing layer and a second CoFe-containing layer, the first CoFe-containing layer contacts the second non-magnetic layer, and the second CoFe-containing layer contacts the first non-magnetic layer.

11. The magnetoresistive element according to claim 8, wherein the first magnetic layer contains a CoFe-containing layer, a first surface of the CoFe-containing layer contacts the second non-magnetic layer, and a second surface opposite to the first surface of the CoFe-containing layer contacts the first non-magnetic layer.

12. The magnetoresistive element according to claim 7, wherein the MgO contained in the second non-magnetic layer contains oxygen in an amount less than that of MgO with a stoichiometric composition.

\* \* \* \* \*